United States Patent [19]

Katayama

[11] Patent Number: 5,243,219
[45] Date of Patent: Sep. 7, 1993

[54] SEMICONDUCTOR DEVICE HAVING IMPURITY DIFFUSION REGION FORMED IN SUBSTRATE BENEATH INTERLAYER CONTACT HOLE

[75] Inventor: Toshiharu Katayama, Hyogo, Japan

[73] Assignee: Mitsubishi Denki Kabushiki Kaisha, Tokyo, Japan

[21] Appl. No.: 941,017

[22] Filed: Sep. 4, 1992

Related U.S. Application Data

[63] Continuation of Ser. No. 716,676, Jun. 19, 1991, abandoned.

[30] Foreign Application Priority Data

Jul. 5, 1990 [JP] Japan .................................. 2-179212

[51] Int. Cl.$^5$ ...................... H01L 29/68; H01L 23/48; H01L 29/54
[52] U.S. Cl. ..................................... 287/740; 257/400; 257/504; 257/306; 257/547
[58] Field of Search .......................... 357/71, 53, 23.6; 257/400, 652, 547, 504, 740, 306

[56] References Cited

U.S. PATENT DOCUMENTS

| | | | |
|---|---|---|---|
| 4,523,216 | 6/1985 | Shiotari | 357/71 |
| 4,754,318 | 6/1988 | Momose | 257/381 |
| 4,803,541 | 2/1989 | Kouda | 357/53 |
| 4,899,203 | 2/1990 | Ino | 357/23.6 |
| 4,916,521 | 4/1990 | Yoshikawa et al. | 357/71 |
| 4,961,104 | 10/1990 | Hirakawa | 257/775 |

FOREIGN PATENT DOCUMENTS 63-268258 11/1988 Japan .

*Primary Examiner*—Rolf Hille
*Assistant Examiner*—Robert Limanek
*Attorney, Agent, or Firm*—Lowe, Price, LeBlanc & Becker

[57] ABSTRACT

A semiconductor device includes an impurity doped polycrystalline silicon layer formed on a first conductivity type semiconductor substrate with an oxide film provided therebetween, an interlayer insulation layer formed on the polycrystalline silicon layer and provided with a contact hole using the surface of the silicon layer as a bottom surface, and a conductive wiring layer formed on the surface of the interlayer insulation layer and on the inner wall surface of said contact hole. A second conductivity type impurity diffusion layer is formed at a region of the surface of the semiconductor substrate located below the contact hole. A pn junction formed between the impurity diffusion layer and the semiconductor substrate ensures insulation against its reverse bias voltage to prevent leakage current to the semiconductor substrate. This semiconductor device is manufactured by, for example, selectively implanting second conductivity type impurities to a region of the surface of the semiconductor substrate, at which region a contact hole is to be formed later.

16 Claims, 8 Drawing Sheets

5,243,219

SEMICONDUCTOR DEVICE HAVING IMPURITY DIFFUSION REGION FORMED IN SUBSTRATE BENEATH INTERLAYER CONTACT HOLE

This application is a continuation of application Ser. No. 07/716,676 filed Jun. 19, 1991, abandoned.

BACKGROUND OF THE INVENTION

1. Field of the Invention

The present invention relates generally to semiconductor devices and a manufacturing method thereof. More particularly, the present invention relates to an arrangement of a semiconductor device including a polycrystalline silicon layer having an electrical connection portion wherein the silicon layer is connected with a conductive wiring layer and a method of manufacturing such device.

2. Description of the Background Art

Conventionally, for element isolation, a thick field oxide film is formed at a portion for isolating transistors, that is, at a field portion, of a MOS (Metal Oxide Semiconductor) type integrated circuit. As a method of forming such field oxide film, a generally-called LOCOS (Local Oxide of Silicon) method has been used in which a thermal oxide film is selectively formed at a part of a surface of a silicon substrate by making use of high acid-resistance of a silicon nitride film ($Si_3N_4$ film). However, the LOCOS method prevents an increase of an integration density of a semiconductor device because of a generally-called bird's beak formed at a section of the film. In recent years, a method has come into use which utilizes a generally called field shield, in place of a field oxide film, as an element isolation means for use in LOCOS or the like. The field shield is directed t element isolation obtained by applying a bias voltage to a shield electrode comprising a conductive layer of polycrystalline silicon or the like and formed on a semiconductor substrate at a field portion, with a thin oxide film provided therebetween. This method enables element isolation at a field portion narrower than that in such a method utilizing a field oxide film as LOCOS method, thereby achieving higher integration density.

An arrangement and manufacturing processes of an element isolating region using a conventional field shield will be described in the following with reference to FIGS. 1A, 1B, and 2A through 2H.

FIGS. 1A and 1B show an example of an element isolation structure obtained by conventional field shield. With reference to these drawings, this element isolation structure obtained by the conventional field shield comprises a field shield electrode 3 including impurity doped polycrystalline silicon formed in thickness of about 2000Å on a surface of a semiconductor substrate 1 formed of single crystalline p type silicon or the like, with an oxide film 2 about 500Å thick provided therebetween by a CVD method or the like. The field shield electrode 3 is covered with an interlayer insulation film 4 about 2000Å thick and a gate electrode 6 is patterned and formed on the surface of the interlayer insulation film 4. At an active region isolated and insulated by the shield electrode 3, the gate electrode is formed on the surface of the semiconductor substrate 1 with a gate insulation film 5 of several hundreds Å in thickness provided therebetween. The gate electrode 6 and the other field shield electrode are covered with an interlayer insulation film 7. The interlayer insulation film 7 is provided with a contact hole 8 at a predetermined position, at which contact hole 8 a conductive wiring of aluminum or the like formed on the surface of the interlayer insulation film 7 and the field shield electrode 3 are electrically connected to each other. The conductive wiring layer 9 is provided for applying a bias voltage to the field shield electrode 3. With reference to FIG. 1B, formed at the opposite sides of the gate electrode 6 in the active region are impurity diffusion layers 10a and 10b of a conductivity type opposite to that of the semiconductor substrate 1, which layers serve as source/drain regions of an MOS field effect transistor. These impurity diffusion layers 10a and 10b are electrically connected to conductive wiring layers 12a and 12b of aluminum or the like at contact holes 11a and 11b, respectively.

Steps of manufacturing a semiconductor substrate having such arrangement wherein elements are isolated by conventional field shield will be described with reference to FIGS. 2A through 2H.

An impurity doped polycrystalline silicon layer 3 is deposited to about 2000Å on the surface of a semiconductor substrate 1 by a CVD method, with an oxide film 2 about 200Å thick formed by thermal oxidation or the like provided therebetween. Thereafter, an interlayer insulation film 4 about 2000Å thick is deposited on the polycrystalline silicon layer 3 by the CVD method (FIG. 2A). Then, the interlayer insulation film 4, the polycrystalline silicon layer 3 and the oxide film 2 are sequentially and selectively etched by photolithography and etching to form a field shield portion (a portion indicated by arrow B in FIG. 2B), and the surface of the semiconductor substrate 1 at the active region surrounded by the field shield portion (a portion indicated by arrow C in FIG. 2B) is exposed. Thereafter, an oxide film of about 2000Å in thickness is deposited over the surface of the semiconductor substrate 1 by the CVD method and then, a sidewall spacer 4a is formed around the field shield portion by anisotropic etching, resulting in the arrangement shown in FIG. 2B. Then, a gate oxide film 5 of about 500Å in thickness is formed on the surface of the semiconductor substrate 1 in the active region by thermal oxidation and then, a polycrystalline silicon layer 6 with impurities such as phosphorus or arsenic doped therein is deposited all over the semiconductor substrate 1 by the CVD method or the like (FIG. 2C). During the thermal oxidation for forming the gate oxide film 5 which is carried out at a high temperature of about 820° C. or above under an oxidizing atmosphere, oxides 13 are formed in several places of the polycrystalline silicon layer 3. The oxides 13 each have a diameter of about 2000Å approximately the same as the grain diameter of the polycrystalline silicon. Since oxide 13 has a diameter of approximately 2000<, providing a polycrystalline layer 3 thicker than 2000Å prevents the formation of oxides 13 capable of extending completely through a thickness of polycrystalline layer 3. Therefore, to prevent formation of a leakage path through polycrystalline layer 3, a layer thickness of at least 2000Å is required. Although the mechanism of formation of such oxide 13 is not definitely understood yet, the formation is thought to be caused by oxidation occurring along grain boundaries of the polycrystalline silicon layer 3 or by oxidation of the polycrystalline silicon grains themselves.

Then, the gate electrode 6 is patterned by photolithography and etching to result in the arrangement shown in FIG. 2D. Thereafter, an interlayer insulation film 7 is formed all over the semiconductor substrate 1

(FIG. 2E). A patterned resist film 14 is formed on the surface of the interlayer insulation film 7, which is used as a mask for anisotropic etching to form a contact hole 8. There would be no problem if such anisotropic etching enabled just a part of the interlayer insulation film 7, which part corresponds to a space serving as the contact hole 8, to be exactly and totally removed at the same time over the whole area of the part in order that the polycrystalline silicon layer 3 exposes its surface at the bottom of the contact hole 8. In practice, however, about 20% over etching is executed in consideration of variations in thickness of the interlayer insulation film 7, the variations resulted from a stepped substrate and variations in characteristic of the etching device. This over etching results in a removal of the oxide film 13 formed below the contact hole 8, thereby forming an opening portion 16 through the polycrystalline layer 3 and the oxide film 2, which opening includes the surface of the semiconductor substrate as a bottom portion (FIG. 2F).

Then, after a removal of the resist film 14, a conductive layer 9a of aluminum or the like is formed over the whole surface of the semiconductor substrate 1 including the inner wall of the contact hole 8 by the CVD method or sputtering (FIG. 2G). Thereafter, the conductive layer 9a is patterned by photolithography and etching to form conductive wiring layers 9, 12a and 12b (FIG. 2H).

The above-described conventional semiconductor device formed through such steps as described above has the following problems.

Since the opening portion 16 is also filled with aluminum at the time of forming the conductive wiring layers 9, 12a and 12b, the opening portion 16 functions as a leakage path causing current to leak between the conductive wiring layer 9 and the semiconductor substrate 1. The opening portion 16 serves as a leakage path when a total thickness of the oxide film 2 and the polycrystalline silicon layer 3 is less than about 20% of the thickness of the interlayer insulation film 4. The reason for this is as follows. That is, the interlayer insulation film 7 varies in thickness from place to place because of its stepped substrate. In addition, the etching devices themselves vary in characteristics such as an etching rate. However, in order to come into contact with the polycrystalline silicon layer 3, dry etching should be carried out to expose the polycrystalline silicon layer 3 at the thickest part of the interlayer insulation film 7. Thus, thinner part of the interlayer insulation film 7 is over etched, which is followed by etching of the oxide 13 at that time. When all the oxide 13 is etched as a result of this over etching, the conductive wiring layer 9 conducts with the semiconductor substrate 1 through the opening portion 16 to serve as a leakage path. Inferring from the variations in thickness of the interlayer insulation film 7 in practice, not all the oxide 13 is etched even at the thinnest part of the interlayer insulation film 4 as a result of over etching but some of it remains on the surface of the semiconductor substrate 1 when the total thickness of the oxide film 2 and the polycrystalline silicon layer 3 exceeds about 20% of the thickness of the interlayer insulation film 7. Therefore, no leakage path is generated. However, if the sum of the thicknesses of the oxide film 2 and the polycrystalline silicon layer 3 is equal to or less than about 20% of the thickness of the interlayer insulation film 7, all the oxide 13 is etched through over etching to generate a leakage path.

Such leakage path causes current to leak through the semiconductor substrate 1, thereby preventing an adequate application of a desired bias voltage to the polycrystalline layer 3 serving as a field shield electrode to deteriorate field characteristics of the field shield portion. Forming of a high acid-resistant nitride film by the CVD method on a surface of a formed oxide film 2 can be employed as a means for preventing a formation of an oxide film 13 in the polycrystalline layer 3 in the above-described conventional steps. However, an increase in the number of CVD steps lowers productivity, thereby preventing an improvement in mass production.

SUMMARY OF THE INVENTION

An object of the present invention is to provide a semiconductor device wherein such as a field shield, contact is made between a conductive wiring layer and a polycrystalline silicon layer formed on a semiconductor substrate of a first conductivity type with a thin oxide film provided therebetween and shorting between the conductive wiring layer and the semiconductor substrate can be prevented.

A semiconductor device according to the present invention includes a semiconductor substrate having a first conductivity type region at least on and near its surface, a polycrystalline silicon layer including impurity ions and formed on the surface of the semiconductor substrate with an oxide film provided therebetween, an interlayer insulation film formed on the polycrystalline silicon layer and provided with a contact hole at a predetermined position, the contact hole including the surface of the polycrystalline silicon layer as a bottom surface, and a conductive wiring layer formed on the surface of the interlayer insulation film and on the inner wall surface of the contact hole. The semiconductor device is characterized by an impurity diffusion layer of a second conductivity type provided at a region of the surface of the semiconductor substrate located below the contact hole.

According to the present invention, formation of an impurity diffusion layer of a second conductivity type at a region of the semiconductor substrate surface located below the contact hole causes a formation of a pn junction between the impurity diffusion layer and the semiconductor substrate. Therefore, even if a conductive wiring layer comes into contact with the semiconductor substrate through a polycrystalline silicon layer and an oxide film, by selecting a voltage to be applied to the polycrystalline silicon layer through the conductive wiring layer so as to cause the pn junction to generate a reversed bias, insulation can be maintained by the pn junction thereby preventing leakage of current. For example, application of the present invention to a wiring contact portion for applying a bias voltage to a field shield electrode ensures a desired bias voltage application to obtain excellent shield characteristics.

In a method of manufacturing a semiconductor device according to the present invention, first, a resist film with a predetermined opening is formed on a surface of a semiconductor substrate of a first conductivity type and second conductivity type impurities are injected by using the resist film as a mask to form a second conductivity type impurity diffusion layer at a predetermined position of the surface of the semiconductor substrate. Then, after a removal of the resist film, an impurity doped polycrystalline silicon layer is formed on the surface of the semiconductor substrate with an oxide film provided therebetween, which is further covered with an interlayer insulation film. Thereafter, the interlayer insulation film is selectively and anisotropically etched to form a contact hole, which contact hole includes the surface of the semiconductor substrate as a bottom surface, at a region of the impurity diffusion layer. Then, a predetermined conductive wiring layer is patterned on the interlayer insulation film including the inner side of the contact hole.

In this manufacturing method, the impurity diffusion layer of a conductivity type opposite to that of the semiconductor substrate is first formed at a region of the surface of the semiconductor substrate at which a contact hole is to be formed. Therefore, even if oxides are formed in the polycrystalline silicon layer during the following steps including thermal process to contact the conductive wiring layer with the semiconductor substrate, a pn junction formed between the impurity diffusion layer and the semiconductor substrate prevents current leakage to the semiconductor substrate.

In accordance with another aspect of the method of manufacturing a semiconductor substrate according to the present invention, after a formation of a contact hole at an interlayer insulation film, second conductivity type impurities are injected in the inner region of the contact hole to form an impurity diffusion layer at a surface of a polycrystalline silicon layer.

According to this manufacturing method, even if an opening is formed in the polycrystalline silicon layer at the contact hole region, the opening allows the second conductivity type impurities to be injected to the surface of the semiconductor substrate. As a result, a second conductivity type impurity diffusion layer is formed at a desired position in self-alignment manner to prevent current leakage to the semiconductor substrate.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

One embodiment of the present invention will be described with reference to FIGS. 3A, 3B and 4A through 4H.

Figure 3A:
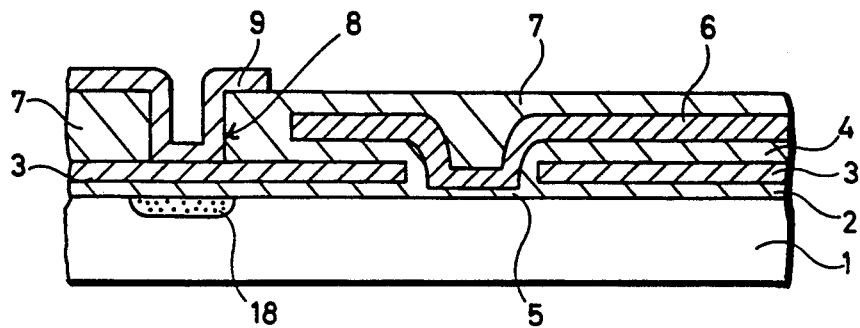
FIG. 3A is a sectional view (taking along line A—A of FIG. 3B) showing an arrangement of a semiconductor device according to one embodiment of the present invention and FIG. 3B is a plan view of the same.
Figure 3B:
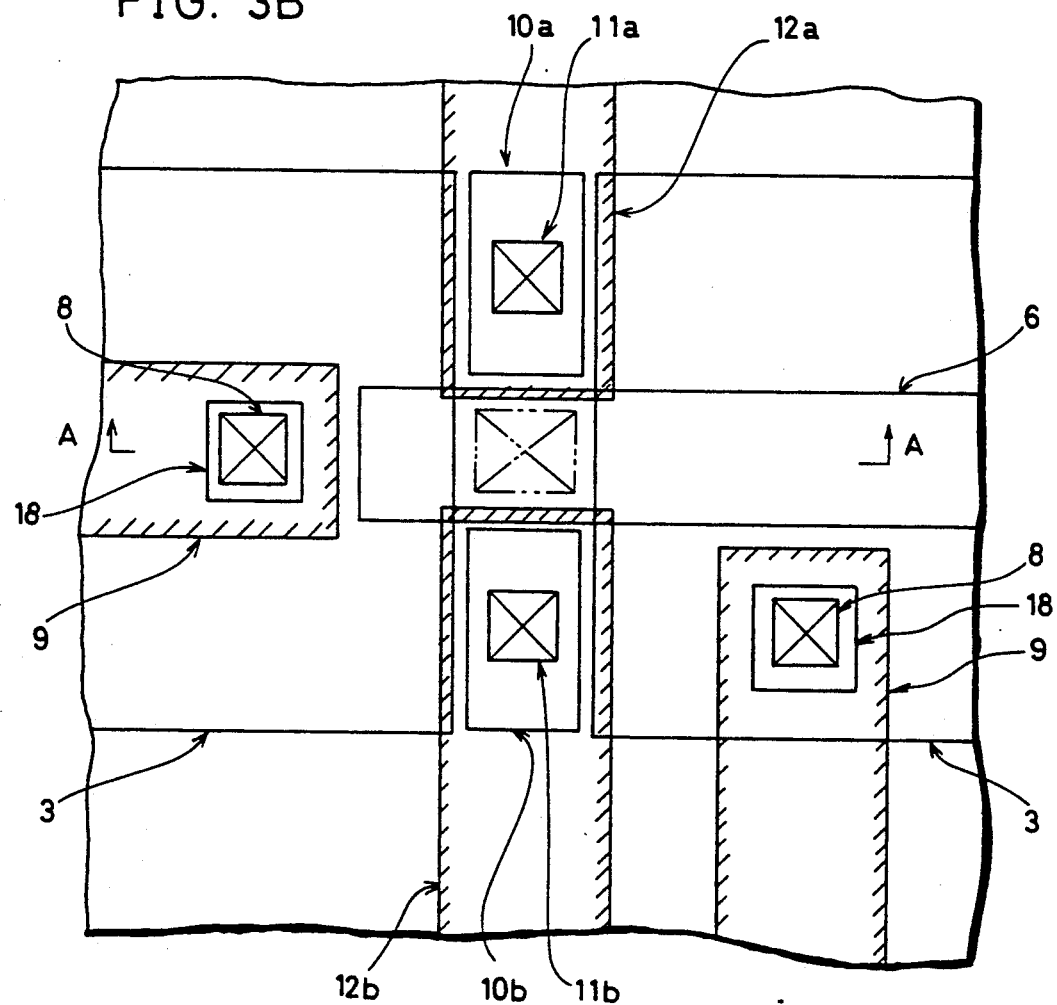

The present embodiment is an application of the present invention to a semiconductor substrate having the same element isolation arrangement using the field shield as of the above-described conventional example. In the element isolation arrangement using the field shield according to the present embodiment, an impurity doped polycrystalline silicon layer 3 having a thickness of about 2000Å is formed by a CVD method or the like on a surface of a semiconductor substrate 1 of e.g. p type single crystalline silicon, with an oxide film 2 of about 500Å in thickness provided therebetween. The polycrystalline silicon layer 3 constitutes a field shield electrode and has a surface covered with an interlayer insulation film 4 of about 2000Å in thickness. A gate electrode 6 is formed by patterning on the surface of the interlayer insulation film 4. The gate electrode, at an active region isolated and insulated by the polycrystalline silicon layer 3 serving as a field shield electrode, is formed on the surface of the semiconductor substrate 1 with a gate insulation film 5 of about several hundreds Å in thickness being provided therebetween. An interlayer insulation film 7 is provided on the gate electrode 6 and on a part of the polycrystalline silicon layer 3 not overlapped with the gate electrode 6. A contact hole 8 is provided at a predetermined position of the interlayer insulation film 7, at which contact hole 8 a conductive wiring layer 9 of aluminum or the like formed on the surface of the interlayer insulation film 7 and the polycrystalline silicon layer 3 are electrically connected to each other. The conductive wiring layer 9 is provided for applying a bias voltage to the polycrystalline silicon layer 3 as a field shield electrode. With reference to FIG. 3B, impurity diffusion layers 10a and 10b having a conductivity type opposite to that of the semiconductor substrate 1 and constituting source/drain regions of an MOS field effect transistor are provided at the opposite sides of the gate electrode 6 in the active region. These impurity diffusion layers 10a and 10b are electrically connected with conductive wiring layers 12a and 12b formed of aluminum or the like at contact holes 11a and 11b, respectively.

Figure 1A:
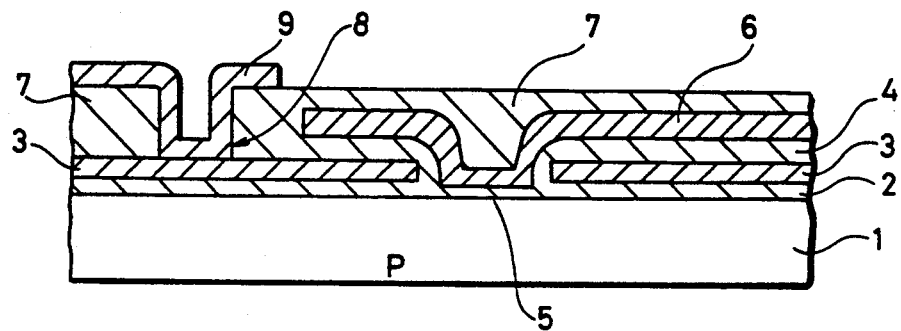
FIG. 1A is a sectional view (take along line A—A of FIG. 1B) showing an arrangement of a conventional semiconductor device and FIG. 1B is a plan view of the same.
Figure 1B:
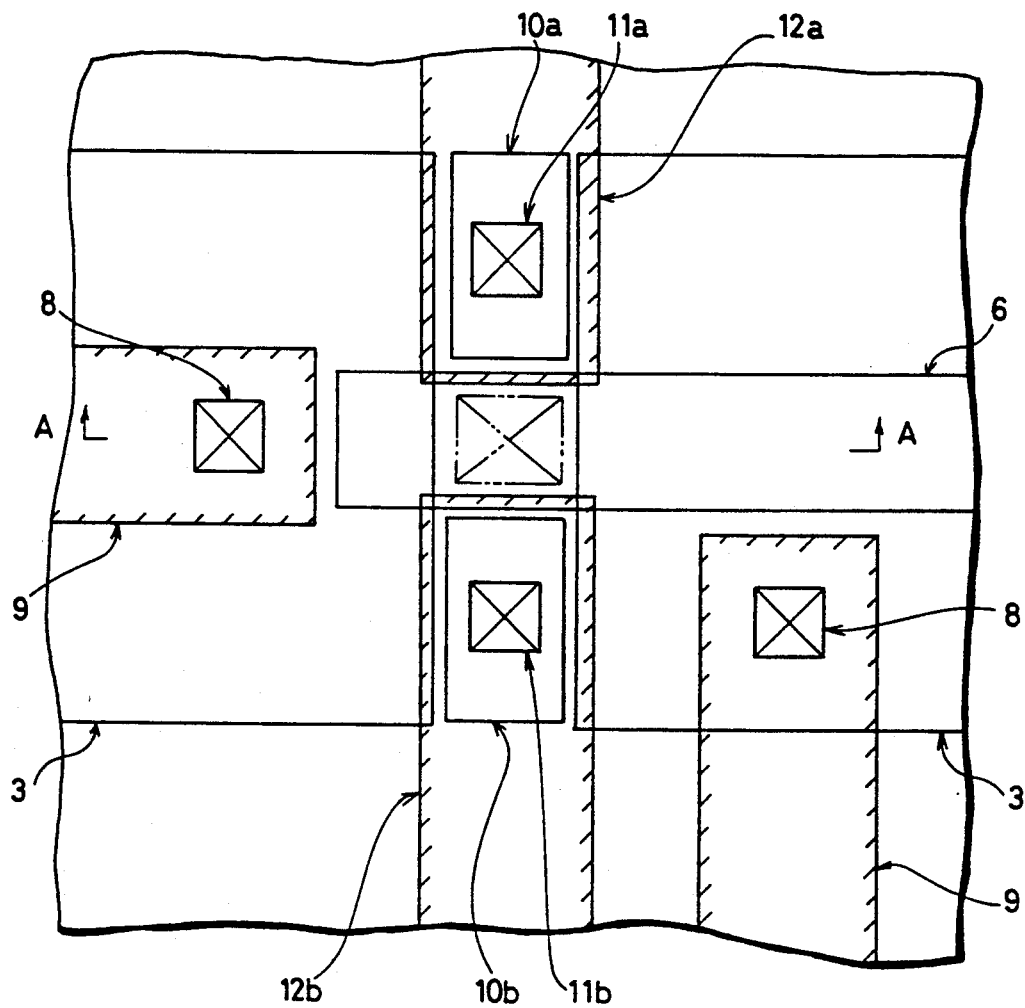

The above described arrangement is identical to that of the conventional example shown in FIGS. 1A and 1B, with the difference being that an impurity diffusion layer 18 is formed on the surface of the semiconductor substrate 1 below the contact hole 8. The impurity diffusion layer 18 has impurities of a conductivity type opposite to that of the semiconductor substrate 1 (n type impurity ions such as phosphorus or arsenic when the semiconductor substrate 1 is a p type single crystalline silicon plate) doped therein and has a pn junction formed at a boundary between the layer 18 and the semiconductor substrate 1. For example, with the semiconductor substrate 1 being provided, an application of a positive bias voltage to the conductive wiring layer 9 results in an application of a reverse bias voltage to the pn junction. Therefore, even when the conductive wiring layer 9 comes into contact with the semiconductor substrate at the bottom portion of the contact hole 8 through the polycrystalline silicon layer 3 and the oxide film 2, insulation between the conductive wiring layer 9 and the semiconductor substrate 1 can be ensured to prevent current from leaking through the semiconductor substrate. As a result, a desired bias voltage can be reliably applied to the polycrystalline silicon layer 3 serving as a field shield electrode, thereby maintaining excellent shield characteristics.

Steps for manufacturing a semiconductor device having such arrangement according to the present embodiment will be described with reference to FIGS. 4A through 4H.

Figure 4A:
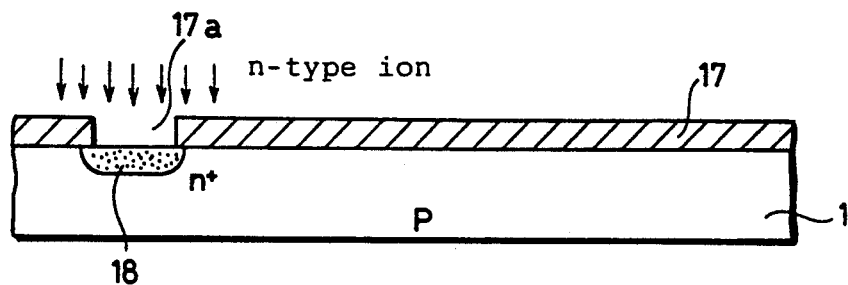
FIGS. 4A, 4B, 4C, 4D, 4E, 4F, 4G and 4H are sectional views showing sequential steps of manufacturing the semiconductor device according to one embodiment of the present invention shown in FIGS. 3A and 3B.

A resist film 17 is first applied to the entire surface of a semiconductor substrate 1 formed of p type silicon single crystal or the like, which is subjected to photolithography and etching to pattern an opening portion 17a into a predetermined shape. Thereafter, at least the vicinity of the opening portion 17a is irradiated with n type ions of phosphorus or arsenic to form an n type impurity diffusion layer 18 at a predetermined position of the surface of the semiconductor substrate 1 by using the resist film 17 as a mask (FIG. 4A).

Figure 4B:
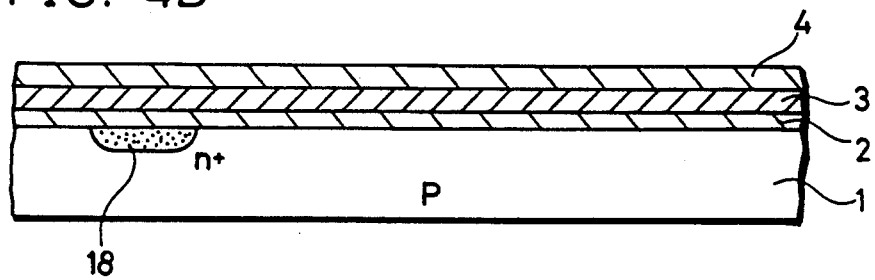
Figure 4C:
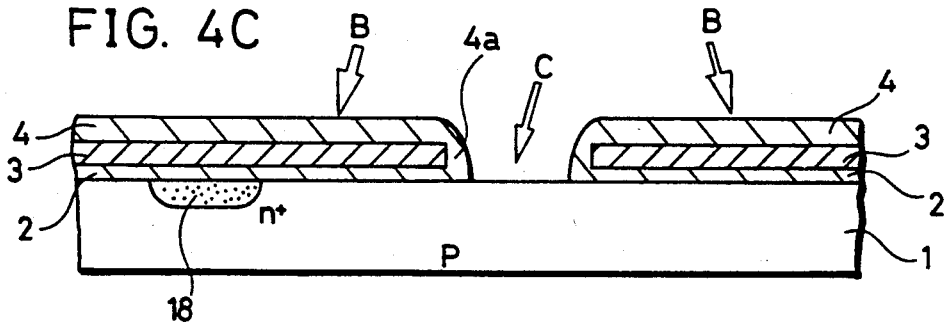

Then, after a removal of the resist film 17, an impurity doped polycrystalline silicon layer 3 is formed in thickness of about 2000Å by a CVD method or the like on the whole surface of the semiconductor substrate 1, with an oxide film 2 of about 500Å formed by thermal oxidation or the like provided therebetween. Thereafter, an interlayer insulation film 4 is deposited in thickness of about 2000Å on the polycrystalline layer 3 also by the CVD method (FIG. 4B). Then, after a formation of a predetermined shaped resist film (not shown) by photolithography and etching, the interlayer insulation film 4, the polycrystalline silicon layer 3 and the oxide film 2 are sequentially and selectively etched to form a field shield portion (the portion indicated by arrow B of FIG. 4C) and to expose a part of the surface of the semiconductor substrate at the active region (the part indicated by arrow C of FIG. 4C) surrounded by the field shield portion. Thereafter, an oxide film of about 2000Å is deposited on the entire surface of the semiconductor substrate 1 by a CVD method or the like, which is anisotropically etched to form a sidewall 4a in the periphery of the field shield portion, resulting in the state shown in FIG. 4C. Then, after forming a gate oxide film 5 about 200Å thick by thermal oxidation on the surface of the semiconductor substrate 1 at the active region, a polycrystalline silicon layer 6 with impurities such as phosphorus and arsenic doped therein is deposited on the entire surface of the semiconductor substrate 1 by a CVD method or the like. In the step of the thermal oxidation for forming the gate oxide film 5 wherein heat treatment is carried out at a high temperature of about 820° C. or above under an oxidizing atmosphere, oxides 13 are formed in places at the polycrystalline silicon layer 3. The diameter of the oxide 13 is about 2000Å approximately equal to the diameter of the polycrystalline silicon grain. The mechanism of a formation of these oxides 13 is identical to that in the step of the above-described conventional example. Therefore, while no oxide 13 extending through a thickness of oxide film 5 is formed in a step of forming the oxide film 5 by thermal oxidation when the thickness of the polycrystalline layer 3 is sufficiently thicker than about 2000Å, oxide 13 does not penetrate through polycrystalline layer 3 having a formed thickness of about 2000Å or less.

Figure 4D:
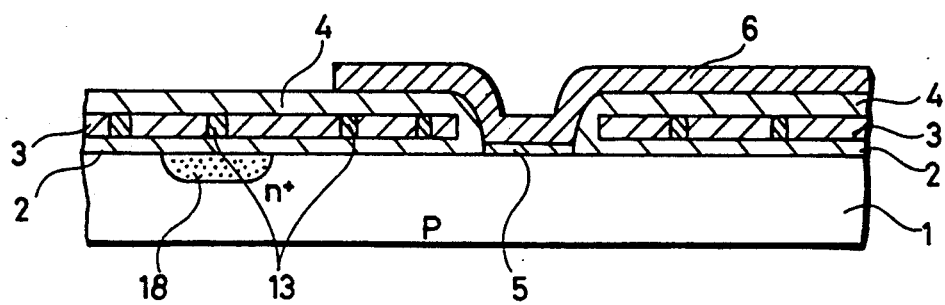
Figure 4E:
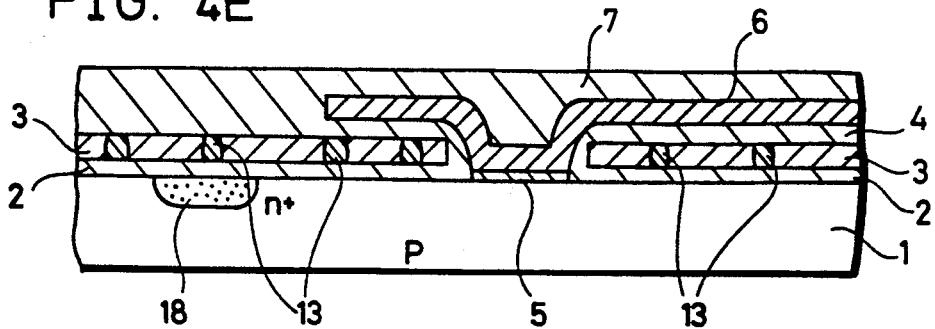
Figure 4F:
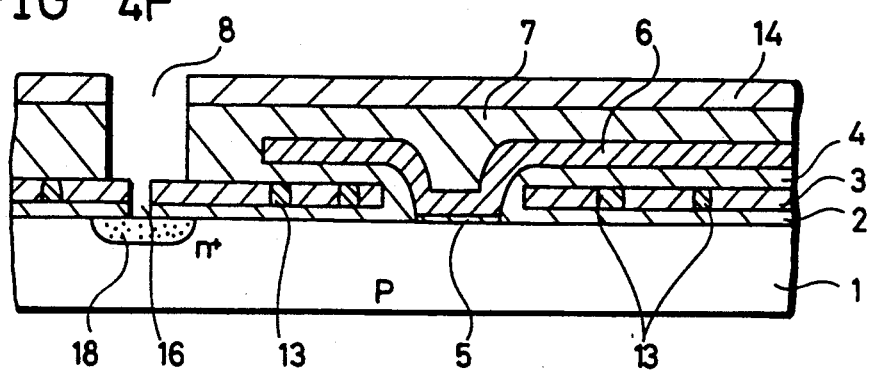
Figure 4G:
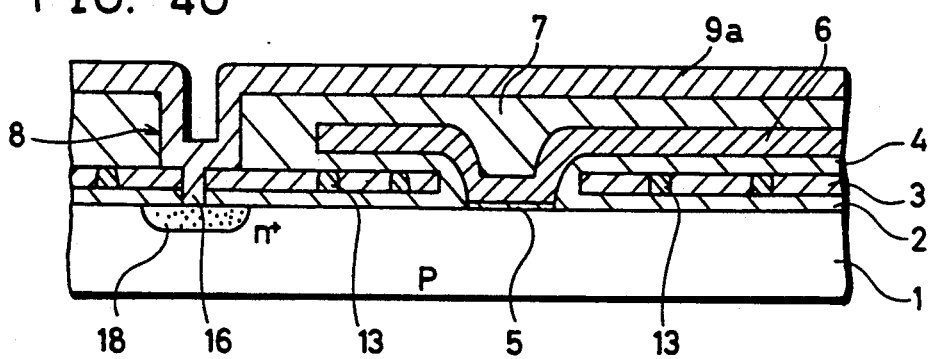
Figure 4H:
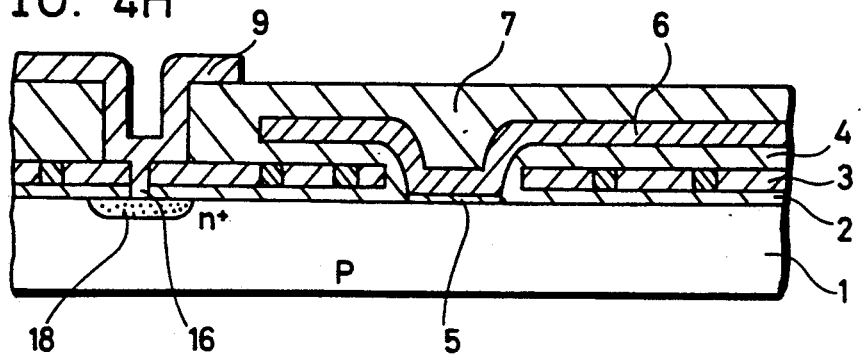

Then, the gate electrode 6 is patterned by photolithography and etching to result in the state shown in FIG. 4D. Thereafter, an interlayer insulation film 7 is formed on the whole surface of the semiconductor substrate 1 (FIG. 4E). A resist film 14 is patterned into a predetermined shape on the surface of the interlayer insulation film 7 and anisotropic etching is executed by using the patterned resist film as a mask to form a contact hole. At the time of this anisotropic etching, the exact part of the interlayer insulation film 7, the part serving as a space of the contact hole 8, should be removed by etching such that the polycrystalline silicon layer 3 exposes its surface at the bottom of the contact hole 8. In practice, however, about 20% over etching is carried out in consideration of variations in thickness of the interlayer insulation film 7 due to a stepped substrate and variations in characteristics of the etching device. This over etching removes the oxide 13 formed below the contact hole 8 to form an opening portion 16 through the polycrystalline silicon layer 3 and the oxide film 2, the opening portion including the surface of the semiconductor substrate 1 as a bottom portion (FIG. 4F). Then, after a removal of the resist 14 film, a conductive layer 9a of aluminum or the like is formed on the whole surface of the semiconductor substrate 1 to include the inner wall of the contact hole 8 by a CVD method or sputtering (FIG. 4G). Thereafter, the conductive layer is patterned by photolithography and etching to form conductive wiring layers 9, 12a and 12b (FIG. 4H).

The process of manufacturing a semiconductor device according to the present embodiment as described in the foregoing differs from the above-described conventional process in that the impurity diffusion layer 18 is first formed at a predetermined place on the surface of the semiconductor substrate 1. The opening portion 17a of the resist film 17 used for forming the impurity diffusion layer 18 is generally made as large as that of the pattern of the resist film 14 for use in etching a contact hole which will be made later. The impurity diffusion layer 18 should be formed at a region slightly larger than the inner circumference of the contact hole 8 because the layer 18 functions to ensure insulation even when the oxides 13 are formed just below the inner circumference of the contact hole 8. However, when in forming the impurity diffusion layer 18 by ion injection, the impurity ions diffuse to a region slightly outside the inner circumference of the opening portion 17a of the resist film 17 as shown in FIG. 4A. Therefore, no problem occurs even if the diameter of the opening 17a is identical to that of the contact hole 8. A region wherein the impurity diffusion layer 18 is to be formed can be more reliably obtained by forming the opening portion 17a of the resist film 17 to have a diameter larger than that of the contact hole 8 by about 0.1 μm in consideration of disalignment of the pattern.

Figure 5A:
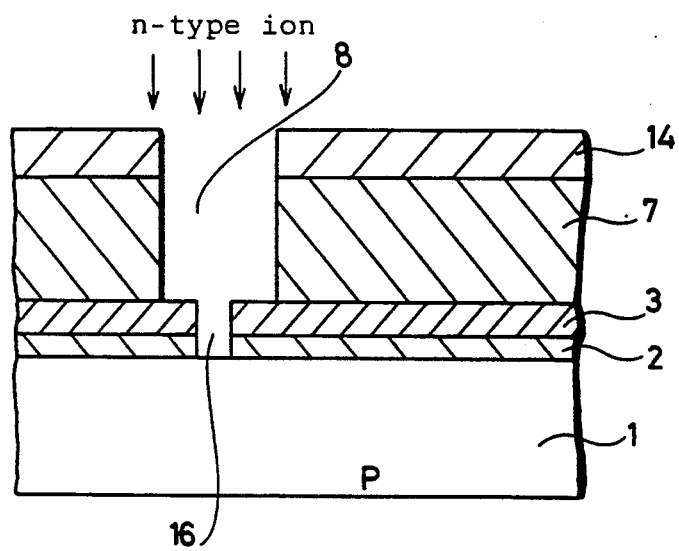
FIGS. 5A, 5B and 5C are sectional views showing sequential steps of an example of another manufacturing method for forming a semiconductor device of the present invention.
Figure 5B:
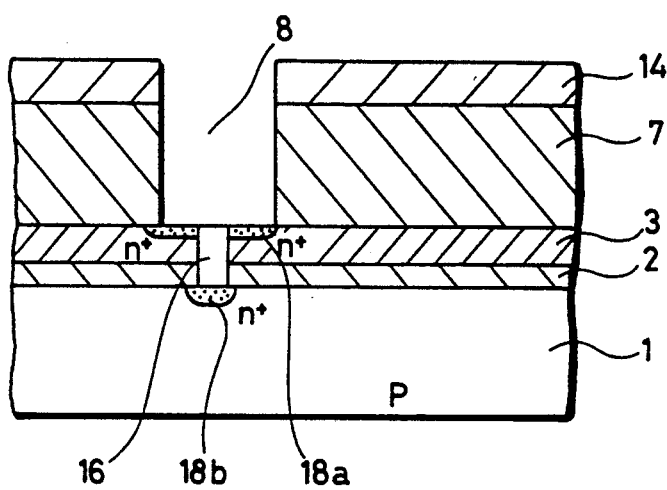
Figure 5C:
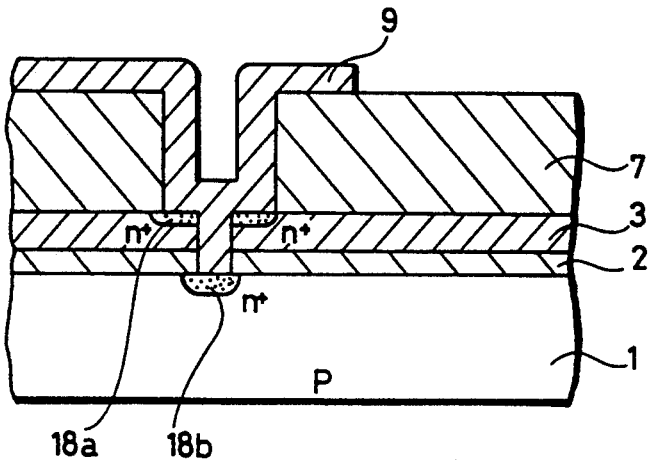

Another example of a process for manufacturing a semiconductor device having the same effects as those of the above-described embodiment will be described with reference to FIGS. 5A through 5C. In this manufacturing process, after forming the arrangement of the above-described conventional example shown in FIG. 2F, a region of the semiconductor substrate 1 at least including the contact hole 8 is irradiated with impurity ions of a conductivity type opposite to that of the semiconductor substrate 1 (FIG. 5A). In a case of the p type semiconductor substrate 1, n type impurity ions such as phosphorus or arsenic are employed for this ion irradiation. Through this ion irradiation, the impurity ions are implanted to the surface of the polycrystalline silicon layer 3 at the bottom portion of the contact hole 8, using the resist film 14 as a mask, thereby forming the impurity diffusion layer 18a. Then, the impurity ions are implanted also to the surface of the semiconductor substrate at the bottom portion of the opening 16 by using the polycrystalline silicon layer 3 as a mask to form the impurity diffusion layer 18b (FIG. 5B). Then, a conductive wiring layer 9 of aluminum or the like is formed on an oxide film 7 and in the contact hole 8 (FIG. 5C).

As described above, according to this manufacturing process, the impurity diffusion layer 18b of a conductivity type opposite to that of the semiconductor substrate 1 is formed in self-alignment manner in the vicinity of the bottom portion of the opening portion 16 made as a result of the formation of oxide 13 in the polycrystalline silicon layer 3. Consequently, an pn junction is formed at the vicinity portion. Therefore, application of a reverse bias voltage to a portion between the conductive wiring layer 9 and the semiconductor substrate 1 allows insulation at the pn junction portion to be maintained, thereby preventing leakage current.

Figure 2A:
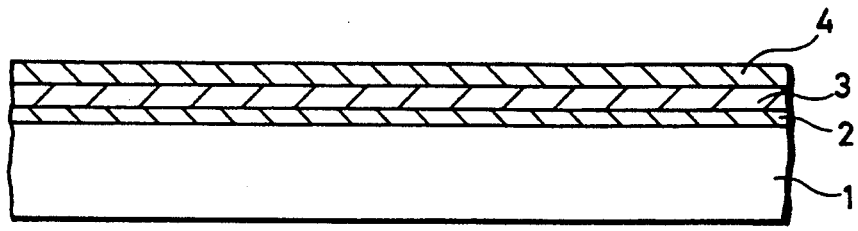
FIGS. 2A, 2B, 2C, 2D, 2E, 2F, 2G and 2H are sectional views showing conventional sequential steps of manufacturing a conventional semiconductor device shown in FIGS. 1A and 1B.
Figure 2B:
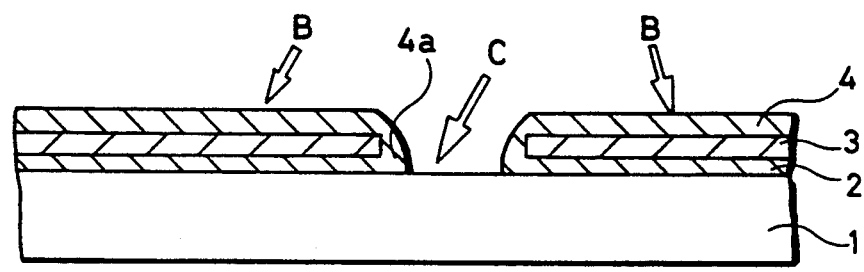
Figure 2C:
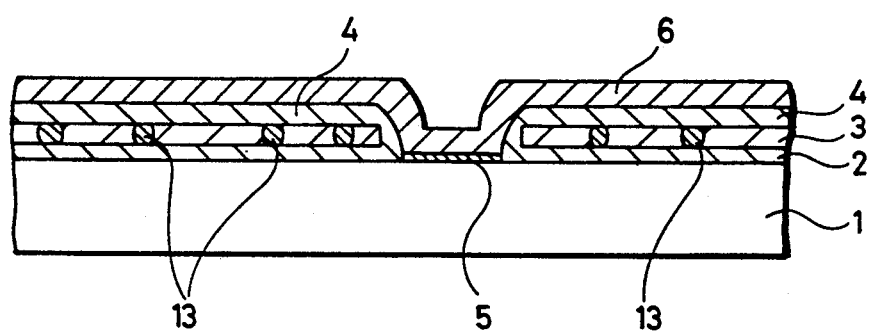
Figure 2D:
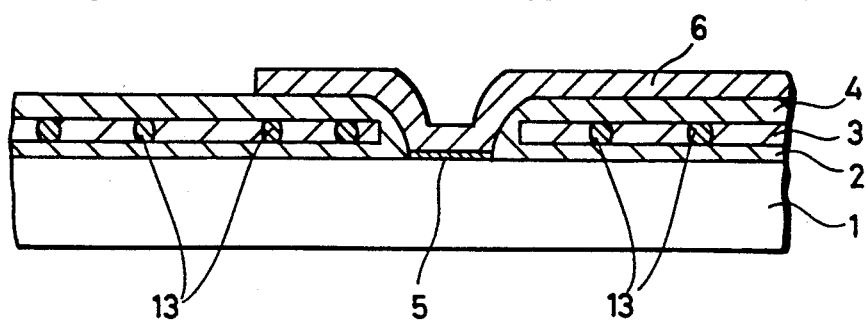
Figure 2E:
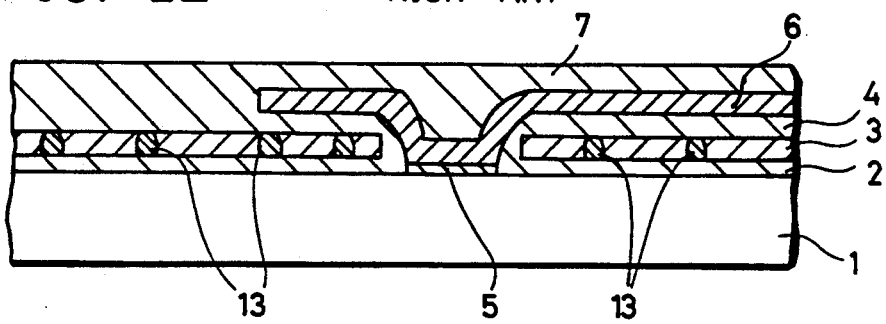
Figure 2F:
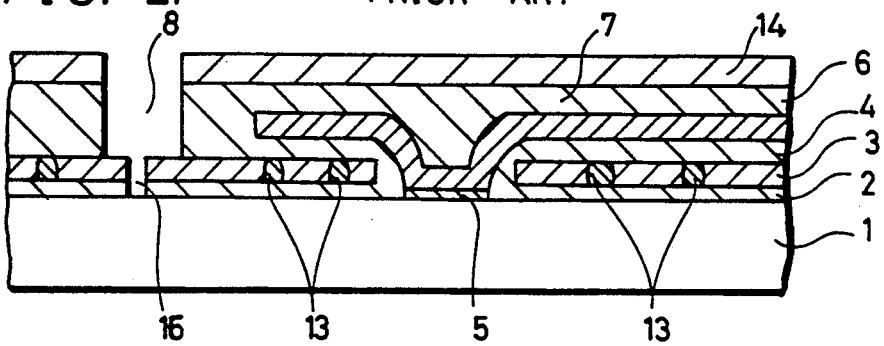
Figure 2G:
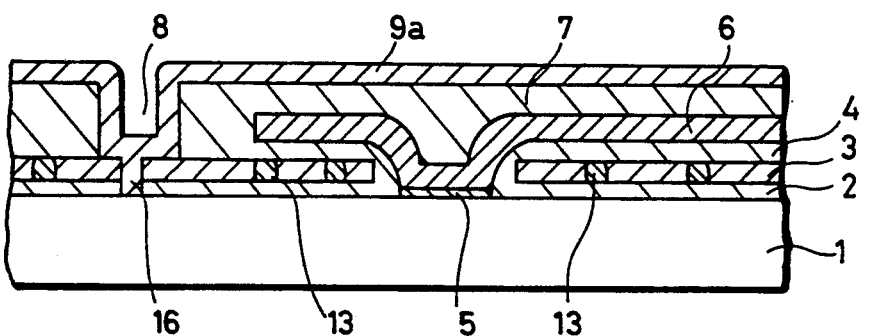
Figure 2H:
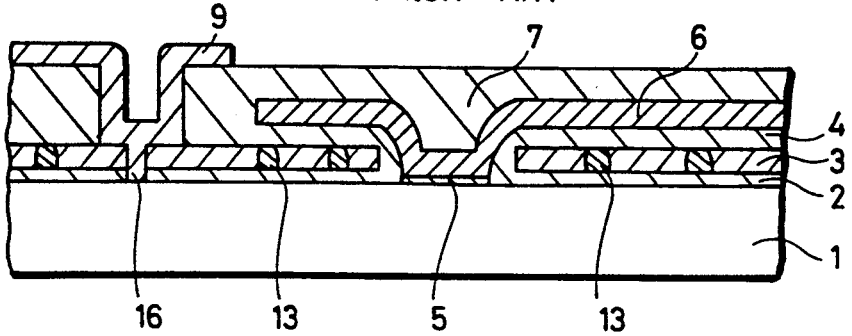
Figure 6:
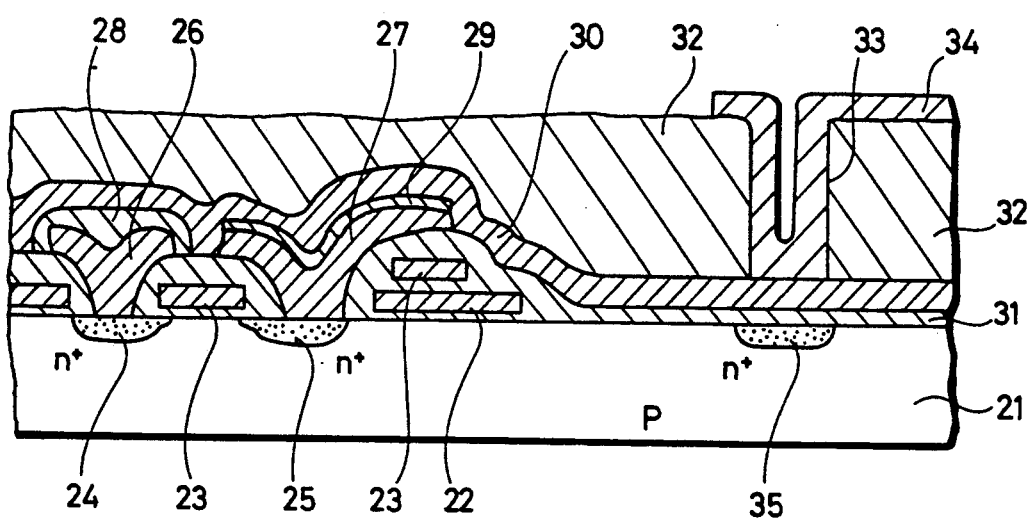
FIG. 6 is a sectional view showing an arrangement of the present invention applied to the peripheral portion of a memory cell portion of a DRAM.

An example of an application of the present invention to a peripheral portion of a memory cell of a DRAM (Dynamic Random Access Memory) will be described with reference to FIG. 6. In a memory cell of the DRAM shown in FIG. 6, the present invention is applied to a contact portion with a conductive wiring for electrically connecting a cell plate with a peripheral circuit at the periphery of the memory cell array. That is, FIG. 6 shows an arrangement of the vicinity of a memory cell portion most closely located to the memory cell array of the DRAM. With reference to FIG. 6, in the arrangement of this memory cell, an MOS field effect transistor including a transfer gate electrode 23, a source region 24 and a drain region 25 are formed in an active region isolated and insulated by a field shield electrode 22 above a semiconductor substrate 21. A bit line 26 is formed on the source region 24 and a storage node 27 is formed on the drain region 25. Then, a cell plate 30 formed of an impurity doped polycrystalline silicon layer is formed above the bit line 26 with an insulation layer 28 provided therebetween and above the storage node 27 with a capacitor dielectric film 29 provided therebetween. At a region outside the active region isolated by the field shield electrode 22, an oxide insulation film 31 is provided between the cell plate 30 and the semiconductor substrate 21. The surface of the cell plate 30 is covered with an insulation layer 32, and a conductive wiring layer 34 for electrically connecting the cell plate 30 and the peripheral circuits is patterned and formed on the layer 32 and in a contact hole 33 which is provided at the predetermined position of the insulation layer 32. An impurity diffusion layer 35 of a conductivity type opposite to that of the semiconductor substrate 21 is formed at the surface of the semiconductor substrate 21 located below the contact portion between the conductive wiring layer 34 and the cell plate 30. The impurity diffusion layer 35 is obtained by implanting impurity ions of a conductivity type opposite to that of the semiconductor substrate 21 by using a resist mask of the same pattern as that of the resist mask for use in forming the contact hole 33 before forming the oxide insulation film 31. As described in the foregoing, a formation of the impurity diffusion layer 35 results in a formation of a pn junction between the semiconductor substrate 21 and the impurity diffusion layer 35. Therefore, leakage current can be prevented in a heat treatment process for flattening the insulation layer 32 or the like in which process such oxide 13 as shown in FIG. 2D is formed at a portion of the polycrystalline silicon layer 30 located just below the contact hole 33, even if the oxide is removed by over etching to bring the conductive wiring layer 34 come into contact with the semiconductor substrate 21.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a structure for avoiding wiring layer to substrate shorting through thermally created oxide defect regions formed in an intervening polycrystalline silicon layer, comprising:

a semiconductor substrate having a region of a first conductivity type at its surface and in the vicinity thereof, an impurity doped polycrystalline silicon layer formed on the surface of the semiconductor substrate with an oxide film provided therebetween, an interlayer insulation layer formed on the polycrystalline silicon layer and provided with a contact hole formed at a predetermined location through the insulation layer and including the surface of the polycrystalline layer as a bottom surface, a conductive wiring layer formed on the surface of the interlayer insulation layer and on the inner wall surface of said contact hole, and an impurity diffusion layer of a second conductivity type formed continuously throughout the entire lateral extent of a region of the surface of said semiconductor substrate located immediately below said contact hole.

2. The semiconductor device according to claim 1, wherein said polycrystalline silicon layer constitutes a field shield electrode for electrically isolating and insulating an active region on said semiconductor substrate, and said polycrystalline silicon layer is supplied with a voltage operating as a reverse bias to a pn junction formed between said impurity diffusion layer and said semiconductor substrate through said conductive wiring layer.

3. The semiconductor device according to claim 1, wherein said semiconductor substrate is formed of p type single crystalline silicon and said impurity diffusion layer has n type phosphorus ions or arsenic ions doped therein.

4. The semiconductor device according to claim 1, further comprising:

a field effect transistor formed on said substrate; and
   a storage capacitor including a first electrode plate connected to said field effect transistor and a second electrode plate electrically isolated from said first electrode plate by a dielectric layer,
   wherein
   said polycrystalline silicon layer constitutes said second electrode plate of said storage capacitor, and
   said conductive wiring layer constitutes a conductive wiring layer in the peripheral portion of the memory cell array, through which layer a predetermined voltage is applied to said second electrode plate.

5. The semiconductor device according to claim 1, wherein said impurity diffusion layer is formed extending over a region slightly larger than a region just below the contact hole.

6. The semiconductor device according to claim 1, wherein, out of the region just below said contact hole, said impurity diffusion layer is formed only at a region just below a part of said polycrystalline silicon layer through which part contact is made with said conductive wiring layer.

7. The semiconductor device according to claim 1, wherein said polycrystalline silicon layer (3) has a thickness no greater than 2000Å.

8. The semiconductor device according to claim 1, wherein oxide regions are formed through said polycrystalline silicon layer.

9. The semiconductor device according to claim 8, wherein said contact hole is formed over one of said oxide regions.

10. The semiconductor device according to claim 8, wherein said oxide regions have a diameter substantially equal to a grain diameter of said polycrystalline silicon layer.

11. The semiconductor device according to claim 8, wherein said oxide regions have a diameter of about 2000Å.

12. The semiconductor device according to claim 1, wherein said conductive wiring layer is formed in contact with said impurity diffusion layer under said contact hole and through said polycrystalline silicon layer.

13. A semiconductor substrate having a structure for inhibiting a leakage current through defect regions of a conductor layer, comprising:
a semiconductor substrate having a region of a first conductivity type;
an oxide film formed on an upper surface of said substrate;
a polycrystalline silicon layer formed on an upper surface of the oxide film over said semiconductor substrate, said polycrystalline silicon layer having oxide impurity regions formed therethrough;
an interlayer insulation layer formed on the polycrystalline silicon layer and having a contact hole formed through the insulation layer;
a conductive wiring layer formed on the surface of the interlayer insulation layer and on the inner wall surface of said contact hole; and
an impurity diffusion layer of a second conductivity type formed in the surface of said semiconductor substrate under said contact hole.

14. The semiconductor device according to claim 13 wherein said contact hole is formed over one of said oxide impurity regions and said conductive wiring layer contacts said impurity diffusion layer through said one oxide impurity region.

15. A semiconductor device formed on a semiconductor substrate, comprising:
a field effect transistor formed on a major surface of said semiconductor substrate, including
(i) a gate electrode formed on said major surface of said semiconductor substrate, and
(ii) first and second source/drain regions formed in said major surface of said semiconductor substrate on opposite sides of said gate electrode;
a storage node including
(i) a first electrode plate formed on said major surface of said semiconductor substrate in contact with said first source/drain region;
(ii) a dielectric layer formed on said first electrode plate, and
(iii) a polycrystalline silicon second electrode plate having a first portion formed on said dielectric layer over said first electrode plate and a second portion formed on a distal portion of said major surface of said semiconductor substrate beyond a lateral edge of said first electrode plate;
an insulating film interposed said distal portion of said semiconductor substrate and said second portion of said major surface of said semiconductor substrate;
an interlayer insulation layer formed on the second portion of said second electrode plate and having a contact hole formed therethrough;
a conductive wiring layer formed on the surface of the interlayer insulation layer and on the inner wall surface of said contact hole; and
an impurity diffusion layer of a second conductivity type formed in said major surface of said semiconductor substrate below said contact hole.

16. The semiconductor device according to claim 15, wherein said conductive wiring layer contacts said major surface of said semiconductor substrate through an one oxide impurity region formed in said second portion of said polycrystalline silicon second electrode plate.

* * * * *